United States Patent
Mohanty et al.

(10) Patent No.: US 10,839,866 B1
(45) Date of Patent: Nov. 17, 2020

(54) MEMORY CORE POWER-UP WITH REDUCED PEAK CURRENT

(71) Applicant: QUALCOMM Incorporated, San Diego, CA (US)

(72) Inventors: Shiba Narayan Mohanty, Bangalore (IN); Rahul Sahu, Bangalore (IN); Channappa Desai, Haveri (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/430,137

(22) Filed: Jun. 3, 2019

(51) Int. Cl.
*G11C 5/14* (2006.01)
*H03K 17/28* (2006.01)
*H03K 17/30* (2006.01)

(52) U.S. Cl.
CPC .............. *G11C 5/148* (2013.01); *G11C 5/14* (2013.01); *H03K 17/28* (2013.01); *H03K 17/30* (2013.01)

(58) Field of Classification Search
CPC .......... G11C 5/148; G11C 5/14; H03K 17/28; H03K 17/30; Y10T 307/461
See application file for complete search history.

(56) References Cited

U.S. PATENT DOCUMENTS

| | | | |
|---|---|---|---|
| 7,696,649 B2 * | 4/2010 | Frey | H03K 17/28 307/139 |
| 9,305,905 B2 * | 4/2016 | Tanadi | G06F 1/26 |
| 9,564,180 B1 | 2/2017 | Pilo et al. | |
| 9,620,178 B1 * | 4/2017 | Masakawa | G11C 11/4072 |
| 2010/0302891 A1 * | 12/2010 | Wang | G11C 5/14 365/226 |
| 2014/0097702 A1 | 4/2014 | Upputuri et al. | |
| 2018/0174643 A1 | 6/2018 | Cheng et al. | |
| 2018/0253129 A1 | 9/2018 | Singh et al. | |

FOREIGN PATENT DOCUMENTS

KR    20080089746 A    10/2008

OTHER PUBLICATIONS

International Search Report and Written Opinion—PCT/US2020/035775—ISA/EPO—dated Aug. 27, 2020.

* cited by examiner

*Primary Examiner* — Vanthu T Nguyen
(74) *Attorney, Agent, or Firm* — Haynes and Boone, LLP

(57) ABSTRACT

A memory is provided with a plurality of cores that power up according to a power-up order from a first core to a final core. As the core power supply voltage for a current core powers up according to the power-up order, it triggers the power-up of a succeeding core in the power-up order responsive to the core power supply voltage exceeding the threshold voltage of a control transistor in the succeeding core.

12 Claims, 5 Drawing Sheets

MEMORY CORE POWER-UP WITH REDUCED PEAK CURRENT

TECHNICAL FIELD

This application relates to memories, and more particularly to a memory with reduced peak current during power-up.

BACKGROUND

Each bitcell in a static random access memory (SRAM) latches a bit through a pair of cross-coupled inverters. As compared to the passive cells in a dynamic random access memory (DRAM), an SRAM bitcell is powered and can thus drive out a bit result during a read operation. SRAM is thus significantly faster than DRAM due to the active nature of the bitcells. However, the powering-up of the bitcells in an SRAM requires an appreciable amount of charge. The amount of charge required at power-up scales with the number of bitcells for a particular memory. The charge is supplied by a core power supply rail carrying a core power supply voltage for the bitcells.

Prior to power-up, the core power supply is isolated from the bitcells through one or more power switch transistors. It is conventional to switch on all of the power switch transistors at power-up. During power-up, the pair of cross-coupled inverters in each bitcell must resolve to a stable, latched state. In that latched state, the output node of one cross-coupled inverter is driven high to the core power supply voltage whereas the remaining cross-coupled inverter's output node remains discharged. The charging of all the output nodes results in a significant peak input current to the memory core during power-up that can damage the memory.

To reduce the peak input current, it is thus conventional to sequence the power-up by memory banks. After a first memory bank is powered up, a second one memory bank is then powered up, and so forth until all the memory banks are powered. The sequencing of the different memory banks is controlled by delay logic having a fixed resistor-capacitor (RC) delay. But this fixed delay is problematic in that the amount of time and peak current for powering-up of a given memory bank depends upon the process, voltage, and temperature (PVT) corner. Since all process corners must be satisfied, the resulting power up time is lengthy. In addition, the delay must be changed as the memory bank size is changed, which makes porting of a design from one process node to another problematic.

Accordingly, there is a need in the art for memories with reduced peak input currents and reduced latency during power-up.

SUMMARY

A memory is disclosed that includes: an external power supply rail; a first core power supply rail configured to provide power to a first plurality of bitcells; a first power switch transistor coupled between the first core power supply rail and the eternal power supply rail; a second core power supply rail configured to provide power to a second plurality of bitcells; a second power switch transistor coupled between the second core power supply rail and the external power supply rail; and a control transistor having a gate connected to the first core power supply rail, wherein the second power switch transistor is configured to switch on in response to a switch on of the control transistor.

In addition, a method of powering up a memory is disclosed that includes the acts of: switching on a first power switch transistor to connect a first core power supply rail for a first core of bitcells to an external power supply rail to charge the first core power supply rail from ground to a core power supply voltage, wherein the core power supply voltage is greater than a threshold voltage for a control transistor; switching on the control transistor responsive to the first core power supply rail charging above the threshold voltage; and responsive to the switching on of the control transistor, switching on a second power switch transistor to connect a second core power supply rail for a second core bitcells to the external power supply rail to charge the second core power supply rail from ground to the core power supply voltage.

Finally, a memory is disclosed that includes: a plurality of bitcells arranged into a plurality of cores, wherein the cores are arranged according to a power-up order; a plurality of power supply rails corresponding to the plurality of cores, each power supply rail being configured to power the corresponding core; and a plurality of control transistors corresponding to the plurality of cores, wherein each control transistor is configured to control a power up of the control transistor's core, and wherein a gate for the control transistor in each successive core in the power-up order is connected to the power supply rail for a preceding core in the power-up order.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To provide a reduced peak input current during memory power-up without requiring excessive delay, the power supply to the bitcells is segregated by its input/output (IO). With regard to the IO, it is traditional for bitcells to be arranged by rows and columns. Each row is addressed by a corresponding word line whereas each column is addressed by a corresponding pair of bit lines. During a read operation, a sense amplifier senses a voltage difference that develops across the bit line pair for an addressed column. The sense amplifier typically has a wider pitch than the bit line pitch so it is conventional for several columns to be multiplexed through a column multiplexer to a single sense amplifier. A read output data latch (the IO) latches a bit decision from the sense amplifier for the selected column. The power supply segregation thus applies to all the bitcells in the columns that are multiplexed to a read output data latch.

The rows and columns for a memory are typically arranged into sub-arrays designated as memory banks. Each memory bank has its own set of read output data latches, arranged from a zeroth read output data latch to a final read output data latch. The number of read output data latches for a memory bank depends upon the word size for the memory bank. For example, if the word size is sixty-four bits wide, the memory bank would include sixty-four read output data latches. The number of independent core power supply rails for a memory bank corresponds on a one-to-one basis with the number of read output data latches. In the previous example of sixty-four read output data latches, the memory bank would have sixty-four different core power supply rails. These rails are powered up sequentially. Each core power supply rail supplies the core power supply to the bitcells in the columns that are multiplexed onto the corresponding read output data latch.

Figure 1:
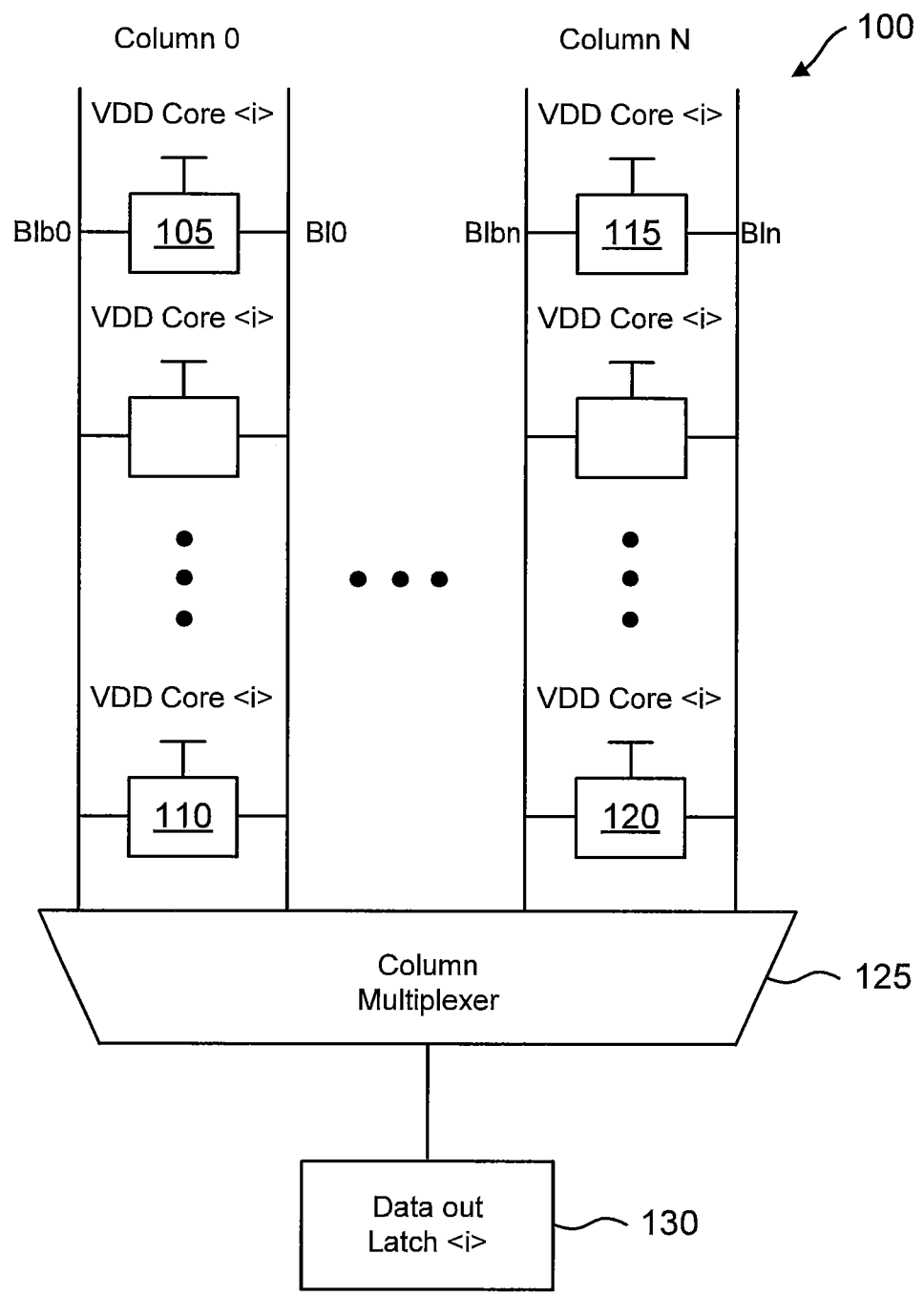
FIG. 1 is a circuit diagram of a memory core for a memory bank in which the bitcells are powered by a core power supply rail that is independent of other core power supply rails in accordance with an aspect of the disclosure.

An example memory core 100 for an ith read output data latch 130 is shown in FIG. 1. The <ith> designation for read output data latch 130 refers to its bit position within the word formed by the collection of read output data latches for a corresponding memory. For example, the number of bits in the word may range from a zeroth bit to an (M−1)th bit, where M is the positive integer for the word width. As used herein, the term "core" refers to the bitcells addressed by the columns that are multiplexed onto a single read output data latch. In core 100, the column multiplexing is an N:1 multiplexing through a column multiplexer 125. There are thus N columns in core 100 ranging from a zeroth column (Column 0) to an (N−1)th column (Column N). The number of bitcells within a single column depends upon the number of rows for the memory bank. For example, if the memory bank that includes core 100 has thirty-two rows corresponding to thirty-two word lines, a single column would have thirty-two bitcells. In column 0 there is thus a first bitcell 105 corresponding to the first row. Each remaining row would also have a corresponding bitcell. For illustration clarity, only three bitcells including bitcell 105 and also a final bitcell 110 for the final row are shown in column 0. Similarly, the (N−1)th column includes a plurality of bitcells ranging from a first bitcell 115 for the first row to a final bitcell 120 for the final row. The total number of bitcells for a core such as core 100 thus depends not only upon the number of rows for the core's memory bank but also upon the column multiplexing. In embodiments without column multiplexing, the number of bitcells per core would equal the number of rows. If the column multiplexing is 2:1, the number of bitcells per core would be twice the number of rows. Similarly, if the column multiplexing is 4:1, the number of bitcells per core would be four times the number of rows. In general, the number of bitcells per core is a product of the number of rows for the memory bank and the order of the column multiplexing. Each bitcell in core 100 is supplied by the same core power supply rail VDD Core <i>. The <ith> designation for the core power supply rail corresponds to the <ith> designation for read output data latch 130.

Given the concept of a memory core power supply rail defined as described above, a memory is disclosed herein that successively powers up the various cores in each memory bank. For example, suppose a memory has a pair of memory banks. The cores in a first one of the memory banks are successively powered up. Once the succession reaches a final one of the cores in the first memory bank, the succession proceeds for the cores in the remaining second memory bank. If a memory has additional memory banks, the succession for the cores would extend across these additional memory banks. The power-up succession would then proceed across the cores in one memory bank to another until all the cores in all the memory banks are powered up.

The succession across the cores is not based upon any rigid fixed delays but instead exploits the ramping up of the core power supply from ground to its final charged state. Each core power supply rail couples through a corresponding power switch transistor to an external power supply rail. When the power switch transistor is switched on for a core, the core power supply rail is charged to a core power supply voltage supplied by the external power supply rail. The core power supply voltage will thus charge from ground to its fully-charged state when the power switch transistor is switched on. The memory architecture disclosed herein advantageously exploits the charging of the core power supply voltage from ground to its fully-charged state by using this charging of the core power supply voltage to control when a successive core begins charging. As used herein, the term "external power supply rail" refers to any suitable power supply rail that is isolated from the core power supply rail through a corresponding power switch transistor. In general, an integrated circuit including a memory as disclosed herein will have various power supply rails for distributing power supply voltages to the assorted components within the integrated circuit. The external power supply rail may be a global power supply rail that provides the core power supply voltage to other components besides the memory. Alternatively, the external power supply rail may be dedicated to the distribution of the core power supply voltage to the memory.

The cores within a memory bank are arranged from a first core to a final core. For a core within this succession, the core power supply from a preceding core controls whether the power switch transistor conducts to power the core. In one embodiment, the power switch transistor for a core may be an n-type metal-oxide semiconductor (NMOS) transistor. In such an embodiment, the core power supply voltage from the preceding core will begin to switch on the power switch transistor for the current core once the core power supply voltage from the preceding core reaches the threshold voltage for the power switch transistor. Although such an NMOS embodiment will advantageously power-up the cores, note that a p-type metal-oxide switch (PMOS) power switch transistor will pass a higher power supply voltage as compared to an NMOS power switch transistor. The following discussion will thus assume without loss of generality that the power switch transistor for each core will be a PMOS power switch transistor.

With regard to the power-on succession of cores within a memory bank, a "current core" refers to the core currently being powered on in the succession. As the succession proceeds a current core becomes the preceding core to another current core. However, the very first core in the first memory bank that is being powered on has no preceding core before it. A control signal controls whether the core power supply for this first core powers on. For each remaining core in the power-on succession, it is the core power supply for the preceding core that controls whether the core's power supply voltage begins powering up. For example, for a second core in the power-up succession, it is the first core's power supply voltage that controls the charging of the second core's power supply voltage. For a third core in the power-up succession, it is the second core's power supply voltage that controls the charging of the third core's power supply voltage, and so on throughout the power-on succession.

Since the power switch transistor for each core is a PMOS power switch transistor, the core power supply voltage from the preceding core drives the gate of an NMOS control transistor in the current core. As the core power supply voltage from the preceding core rises above the threshold voltage of the control transistor in the current core, the control transistor in the current core switches on to ground the gate of the PMOS power switch transistor for the current core. This grounding of the gate for the power switch transistor switches on the power switch transistor so that the current core's power supply voltage begins charging. In turn, this current core becomes the preceding core for a new current core in the power-on succession. The power-on succession may be deemed to correspond to an integer succession: a first core, a second core, a third core, a fourth core, and so on. The charging of the core power supply voltage for an ith core to the threshold voltage thus determines when the core power supply voltage for the (i+1)th core begins charging, where i is a positive integer within the integer succession.

Figure 2:
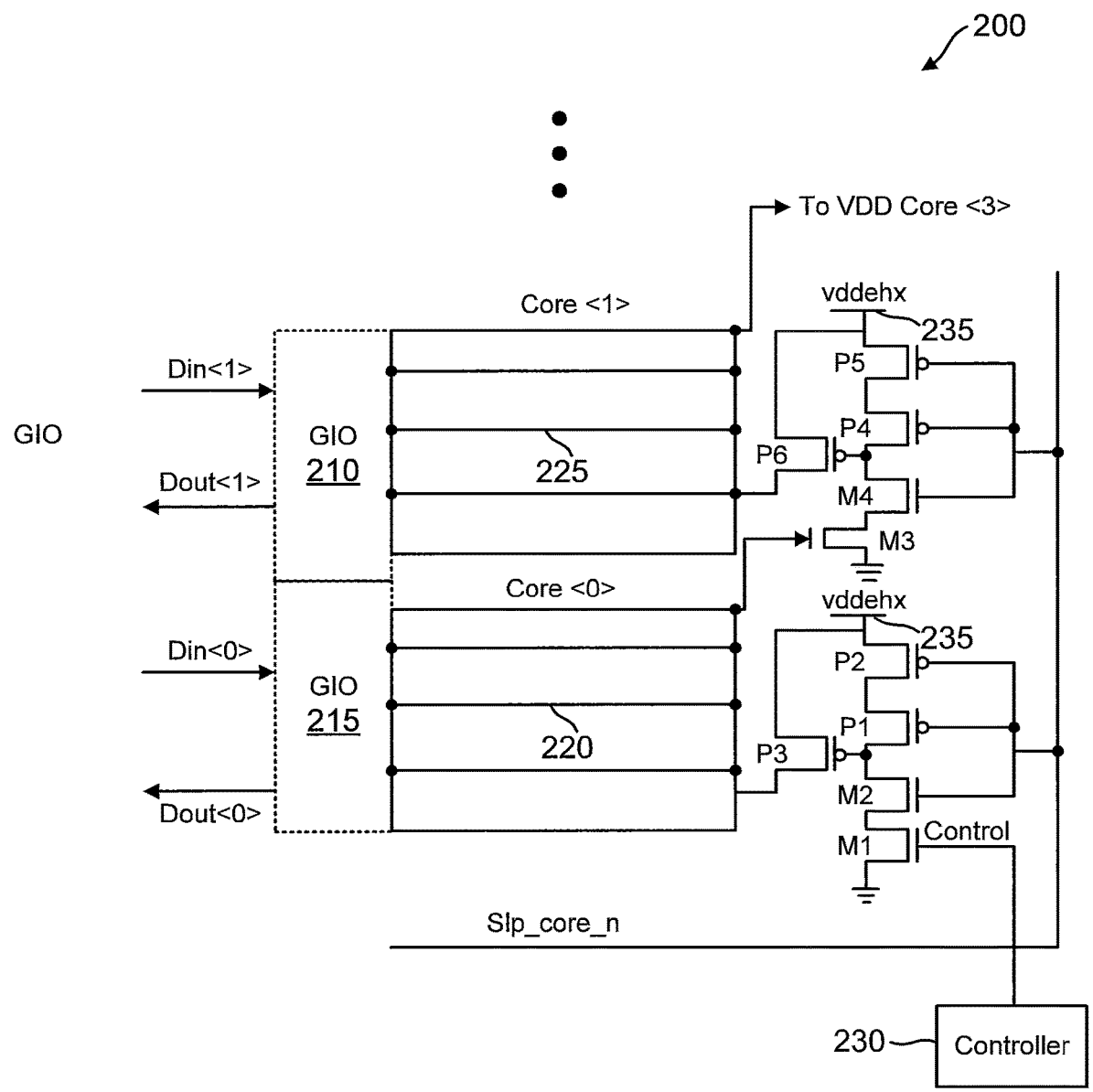
FIG. 2 illustrates a zeroth memory core and a first memory core each having an independent core power supply rail configured for successive power-up in accordance with an aspect of the disclosure.

A memory bank 200 including a plurality of cores that are powered-on according to an embodiment of the power-on succession disclosed herein is shown in FIG. 2. For illustration clarity, only a core <0> and a core <1> are shown for memory bank 200. Each core includes a plurality of bitcells (not illustrated) as discussed with regard to core 100 of FIG. 1. For example, core <0> includes the bitcells in the columns addressed by a zeroth read output data latch. These bitcells are powered by a core <0> power supply rail 220. The zeroth read output data latch and other addressing components such as a word line decoder and column address decoder are represented by a global input/output (GIO) circuit 215 for core <0>. During a write operation, GIO circuit 215 receives a zeroth bit Din<0 of an input word to be written to memory bank 200. Depending upon the addressing, this zeroth bit is then written to one of the bitcells in core <0>. During a read operation, GIO circuit 215 outputs a zeroth bit Dout<0> of the output word being read from memory bank 200. Similarly, core <1> includes all the bitcells corresponding to a first read output data latch as represented by a GIO circuit 210. GIO circuit 210 receives the first bit of the input word and outputs the first bit of the output word.

To begin the power-on of memory bank 200, a controller 230 asserts a control signal that drives a gate of an NMOS control transistor M1 for core <0>. To coordinate the power-up with a sleep mode, a drain of control transistor M1 connects to a source of an NMOS transistor M2 having a drain connected to a drain of a PMOS transistor P1. A source of transistor P1 connects a drain of another PMOS transistor P2 having a source connected to an external power supply rail 235 supplying an external power supply voltage vddehx. Transistors P1 and P2 may be replaced by a single PMOS transistor in alternative embodiments. An active low sleep signal (Slp_core_n) drives the gates of transistors M2, P1, and P2.

The source of control transistor M1 connects to ground so that the source of transistor M2 is grounded when the control signal is asserted. Transistors P2, P1, and M1 thus act as an inverter to invert the sleep signal while the control signal is asserted. During normal operation, the sleep signal is asserted high to the external power supply voltage vddhx. The inverter formed by transistors M1, P2, and P1 thus invert this high value for the sleep signal so that the drains of transistors P1 and M2 are grounded. These drain nodes are tied to a gate of a PMOS power switch transistor P3 having its source connected to external power supply rail 235 and a drain connected to a core <0> power supply rail 220. Prior to power-up, the voltage of core<0> power supply rail 220 is at ground. But in response to the switching on of power switch transistor P3, core <0> power supply rail 220 charges up to the core power supply voltage vddehx carried on external power supply rail 235.

To cause a succession of power-up from one core to another, core <0> power supply rail 220 is connected to a gate of an NMOS control transistor M3 for core <1>. In core <1>, first control transistor M3, an NMOS transistor M4, a PMOS transistor P4, a PMOS transistor P5, and a PMOS first power switch transistor P6 are all arranged analogously as discussed for their counterpart transistors M1, M2, P1, P2, and P3 in core <0>. In that regard, transistors P5, P4, and transistor M4 function as an inverter when control transistor M3 switches on in response to core <0> power supply rail 220 being charged above the threshold voltage for control transistor M3. As discussed with regard to core <0>, transistors P5 and P4 may be replaced by a single PMOS transistor in alternative embodiments. The active low sleep signal Slp_core_n drives the gates of transistors M4, P4, and P5. With control transistor M3 discharging the source of transistor M4, transistors M4, P4, and P5 function as an inverter to invert the charged state of the sleep signal during normal operation so as to ground the gate of power switch transistor P6. Power switch transistor P6 will thus start conducting when the core <0> power supply rail 220 is charged above the threshold voltage for control transistor M3. The source of power switch transistor P6 is tied to external power supply rail 235 whereas its drain is connected to a core <1> power supply rail 225. Core <1> power supply rail 225 supplies the core power supply voltage to all the bitcells in core <1>.

Core <1> power supply rail 225 will then charge from ground to the core power supply voltage vddehx. As it does so, it will pass the threshold voltage for a control transistor in a core <2> (not illustrated) such that the power supply rail for this second core will begin to charge towards the power supply voltage vddehx. In turn, the powering up of the second core triggers the powering up of a third core and so on.

Figure 3:
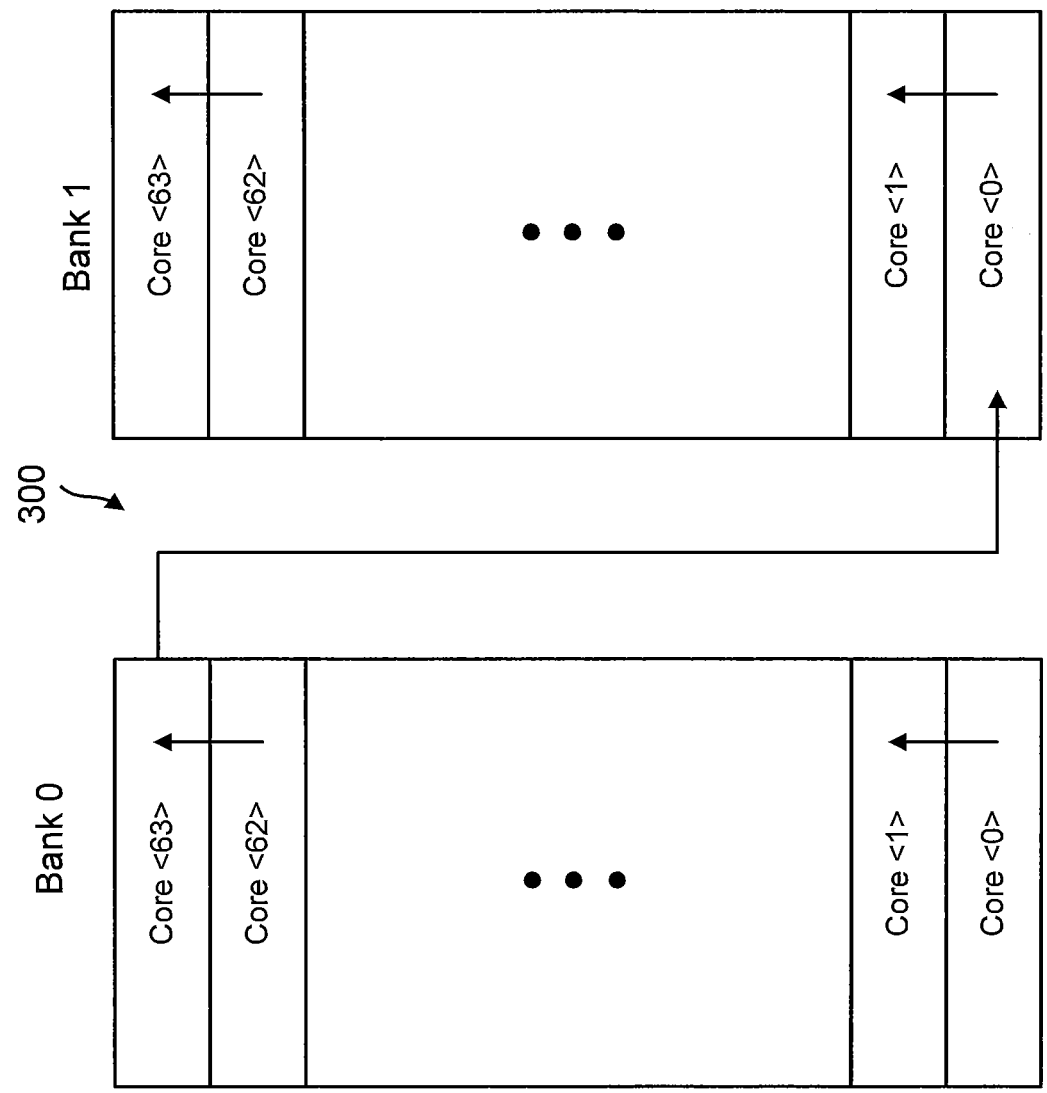
FIG. 3 illustrates a memory in which each memory bank includes a plurality of cores configured for successive power-up in accordance with an aspect of the disclosure.

This successive power-up of cores is further illustrated in FIG. 3 for a memory 300 having a bank 0 and a bank 1. In memory 300, each bank has sixty-four cores, ranging from a core <0> to a core <63>. Core <0> in bank 0 is analogous to core <0> in memory bank 200 in that it is this core that will respond to the assertion of the control signal. As the core power supply voltage then rises for core <0> above the threshold voltage, it triggers the power up of the core power supply voltage for core <1> in bank 0. In turn, the successive power-up of the cores continues until the final core <63> in bank 0 begins to power up. The power supply rail in this sixty-third core is tied to a control transistor (not illustrated) in core <0> in bank 1. The successive power-up of the cores in bank 0 will thus trigger a successive power-up of the cores in bank 1 until a final core <63> is bank 1 is fully charged.

Although it is convenient to make the power-up order of the cores match the bit succession for the data output word for each bank, it will be appreciated that the order is arbitrary and can be varied in alternative embodiments. In addition, the order need not be from core to core but instead may be from one group of cores to another. For example, the power supply rail for successive groups of two cores may be tied together such that a pair of cores is powered up in common. Once the core power supply voltage for a first pair of cores reaches the threshold voltage for a second pair of cores, the power-up of the second pair of cores is triggered, and so on.

Figure 4:
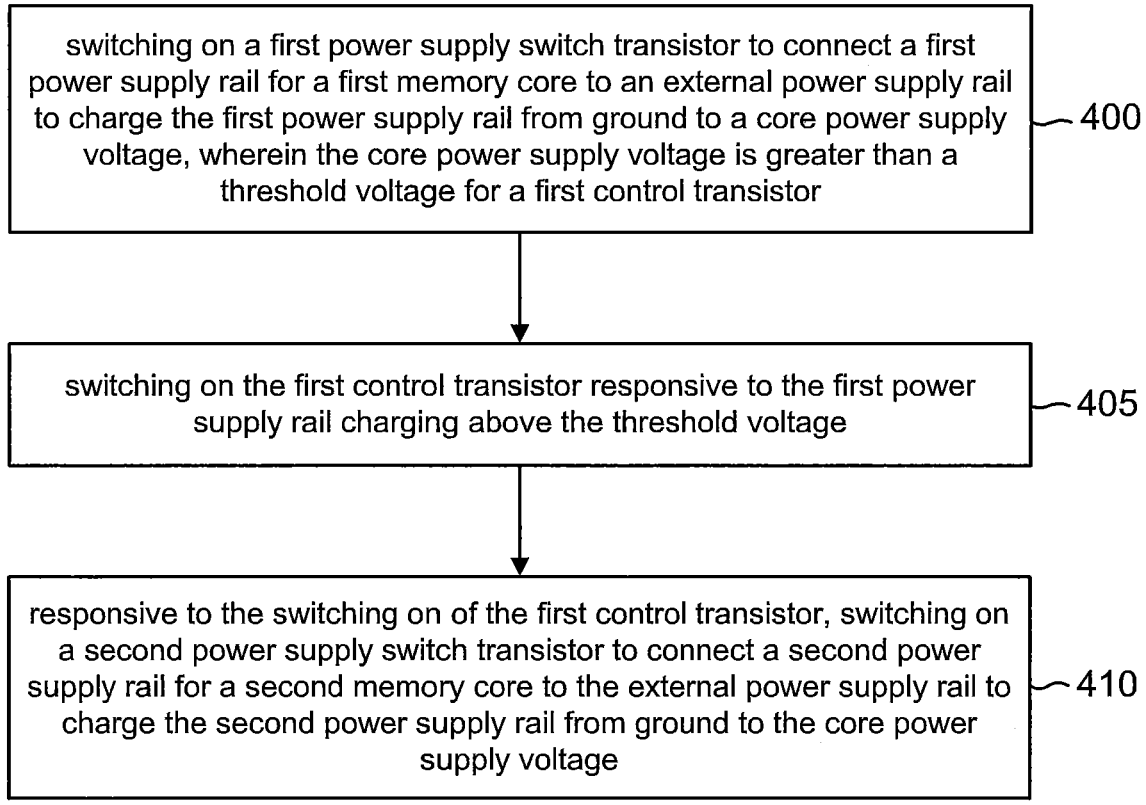
FIG. 4 is a flowchart for a method of successively powering up cores for a memory in accordance with an aspect of the disclosure.

An example power-up method will now be discussed with reference to the flowchart of FIG. 4. The method includes an act 400 of switching on a first power switch transistor to connect a first power supply rail for a first memory core to an external power supply rail to charge the first power supply rail from ground to a core power supply voltage, wherein the core power supply voltage is greater than a threshold voltage for a first control transistor. The switching on of power switch transistor P3 in core <0> of memory bank 200 is an example of act 400. In addition, the method includes an act 405 of switching on the first control transistor responsive to the first power supply rail charging above the threshold voltage. The switching on of control transistor M3 in core <1> of memory bank 200 is an example of act 405. Finally, the method includes an act 410 that is responsive to the switching on of the first control transistor and includes switching on a second power switch transistor to connect a second power supply rail for a second memory core to the external power supply rail to charge the second power supply rail from ground to the core power supply voltage. The charging of core <1> power supply rail 225 in memory bank 200 is an example of act 410.

Figure 5:
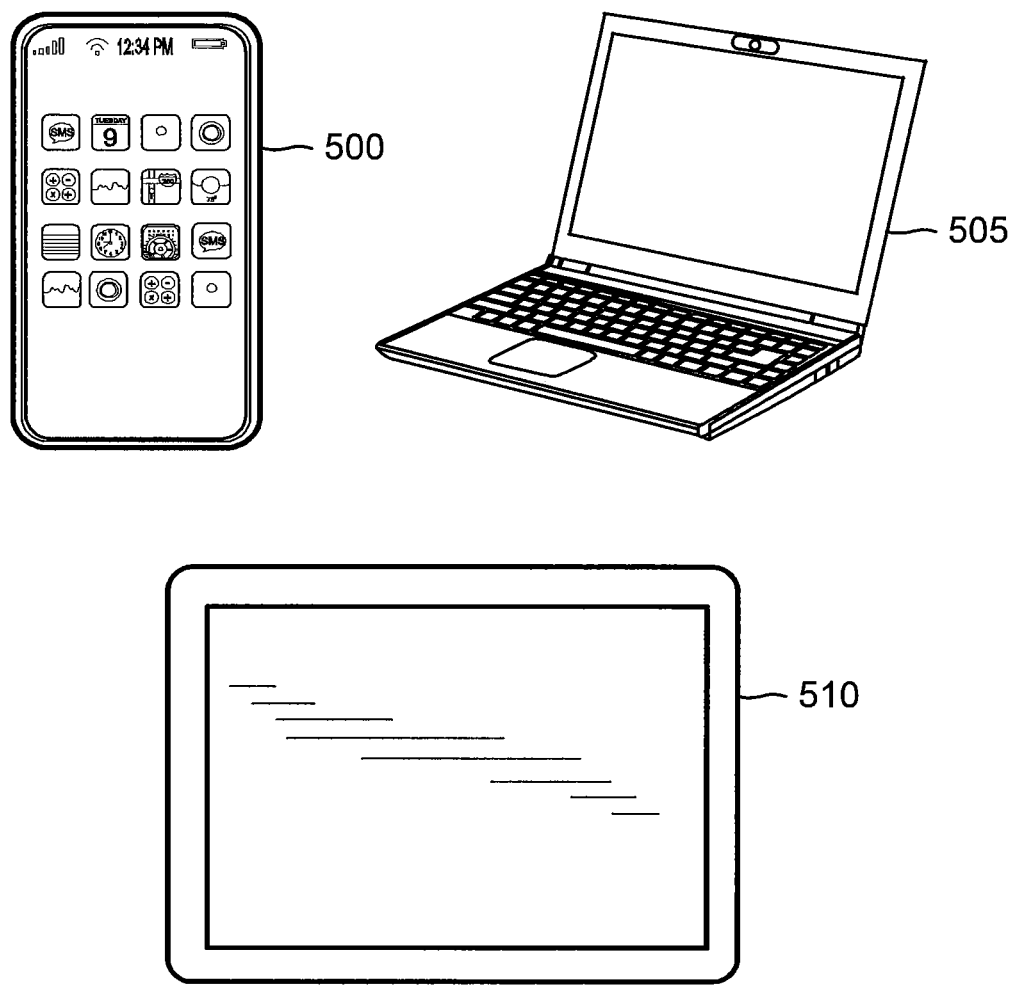
FIG. 5 illustrates some example systems incorporating a memory configured for successive power-up of memory cores in accordance with an aspect of the disclosure.

A memory with a successive power-up of cores as disclosed herein may be incorporated into a wide variety of electronic systems. For example, as shown in FIG. 5, a cell phone 500, a laptop 505, and a tablet PC 510 may all include a memory having a successive power-up of cores in accordance with the disclosure. Other exemplary electronic systems such as a music player, a video player, a communication device, and a personal computer may also be configured with memories constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory comprising:
an external power supply rail;
a first core power supply rail configured to provide power to a first plurality of bitcells;
a first power switch transistor coupled between the first core power supply rail and the external power supply rail;
a first control transistor configured to switch on in response to a control signal, wherein the first power switch transistor is configured to switch on in response to the switch on of the first control transistor;
a second core power supply rail configured to provide power to a second plurality of bitcells;
a second power switch transistor coupled between the second core power supply rail and the external power supply rail;
a first inverter configured to invert a sleep signal and to drive a gate of the second power switch transistor, and a second control transistor having a source connected to ground and a drain connected to a ground node of the first inverter and having a gate connected to the first core power supply rail, wherein the second power switch transistor is configured to switch on in response to a switch on of the second control transistor and an assertion of the sleep signal to a power supply voltage and is configured to switch off in response to the switch on of the second control transistor and a discharge of the sleep signal to ground.

2. The memory of claim 1, wherein the second power switch transistor is a p-type metal-oxide semiconductor (PMOS) transistor and the control transistor is an NMOS transistor.

3. The memory of claim 1, wherein the first power switch transistor is a PMOS transistor having a source connected to the external power supply rail and a drain connected to the first power supply rail, and wherein the first control transistor is an NMOS transistor having a source connected to ground and a drain coupled to a gate of the first power switch transistor.

4. The memory of claim 3, further comprising:
a second inverter configured to invert the sleep signal, wherein the drain of the first control transistor is connected to a ground node for the second inverter, and wherein an output node of the second inverter is connected to the gate of the first power switch transistor.

5. The memory of claim 1, further comprising:
a third core power supply rail configured to provide power to a third plurality of bitcells;
a third power switch transistor coupled between the third core power supply rail and the external power supply rail; and
a second control transistor having a gate connected to the second core power supply rail, wherein the third power switch transistor is configured to switch on in response to a switch on of the second control transistor.

6. The memory of claim 5, wherein the third power switch transistor is PMOS transistor and the second control transistor is an NMOS transistor having a source connected to ground and a drain coupled to a gate of the third power switch transistor.

7. The memory of claim 1, wherein the first plurality of bitcells and the second plurality of bitcells are arranged in a first memory bank having a final plurality of bitcells configured to be powered by a final power supply rail, the memory further comprising:
a second memory bank including:
a third plurality of bitcells configured to be powered by a third core power supply rail;
a third power switch transistor coupled between the third core power supply rail and the external power supply rail; and
a third control transistor having a gate connected to the final power supply rail, wherein the third power switch transistor is configured to switch on in response to a switch on of the second control transistor.

8. The memory of claim 1, wherein the first plurality of bitcells are arranged into a first plurality of columns, and wherein the second plurality of bitcells are arranged into a second plurality of columns.

9. A method of powering up a memory, comprising:
switching on a first control transistor in response to an assertion of a control signal;

in response to the switching on of the first control transistor, switching on a first power switch transistor to connect a first core power supply rail for a first core of bitcells to an external power supply rail to charge the first core power supply rail from ground to a core power supply voltage, wherein the core power supply voltage is greater than a threshold voltage for a second control transistor;

switching on the second control transistor responsive to the first core power supply rail charging above the threshold voltage to supply ground to an inverter;

inverting a sleep signal through the inverter while the second control transistor is switched on and while the sleep signal is charged to the core power supply voltage to discharge an inverter output signal;

responsive to the discharge of the inverter output signal, switching on a second power switch transistor to connect a second core power supply rail for a second core of bitcells to the external power supply rail to charge the second core power supply rail from ground to the core power supply voltage;

inverting the sleep signal through the inverter while the second control transistor is switched on and while the sleep signal is discharged to charge the first inverter output signal to the core power supply voltage; and responsive to the charge of the first inverter output signal to the core power supply voltage, switching off the second power switch transistor.

10. The method of claim 9, wherein the first core of bitcells and the second core of bitcells are arranged in a first bank for the memory, the method further comprising:

powering up a final core power supply rail in the first bank for the memory from ground to the core power supply voltage;

switching on a third control transistor responsive to the final core power supply voltage charging above the threshold voltage; and responsive to the switching on of the third control transistor, switching on a third power supply switch transistor to connect a third power supply rail for a third core of bitcells in a second bank for the memory to the external power supply rail to charge the third power supply rail from ground to the core power supply voltage.

11. The method of claim 10, further comprising:

successively powering up a plurality of additional cores in the second bank for the memory according to a power-up order, wherein each successive additional core powers up responsive to a core power supply for a preceding additional core rising above the threshold voltage.

12. The method of claim 9, further comprising:

switching on a third control transistor responsive to the second core power supply rail charging above the threshold voltage; and responsive to the switching on of the third control transistor, switching on a third power switch transistor to connect a third core power supply rail for a third core of bitcells to the external power supply rail to charge the third core power supply rail from ground to the core power supply voltage.

\* \* \* \* \*